United States Patent [19]

Kato

[11] Patent Number: 5,760,430
[45] Date of Patent: Jun. 2, 1998

[54] CHARGE TRANSFER DEVICE AND SOLID-STATE IMAGING APPARATUS USING THE SAME DEVICE

[75] Inventor: Naoki Kato, Kanagawa, Japan

[73] Assignee: Sony Corporation, Japan

[21] Appl. No.: 779,889

[22] Filed: Jan. 7, 1997

[30] Foreign Application Priority Data

Jan. 9, 1996 [JP] Japan ................. 8-001414

[51] Int. Cl.$^6$ .................. H01L 27/148; H01L 29/768
[52] U.S. Cl. .................. 257/236; 257/231; 257/232; 257/233; 257/238; 257/245; 377/61; 377/62; 348/295
[58] Field of Search .................. 257/231, 232, 257/233, 236, 238, 245; 377/61, 62; 348/295

[56] References Cited

U.S. PATENT DOCUMENTS

| | | |
|---|---|---|
| 4,047,216 | 9/1977 | French . |
| 4,280,068 | 7/1981 | Snijder .................. 307/221 |
| 4,324,988 | 4/1982 | Takemura et al. .................. 307/221 |
| 5,521,405 | 5/1996 | Nakashiba .................. 257/268 |

*Primary Examiner*—Ngân V. Ngô
*Attorney, Agent, or Firm*—Ronald P. Kananen

[57] ABSTRACT

A charge transfer device is disclosed in which the number of transfer clocks can be decreased, and also, power consumption, the heating amount and parasitic emissions are also reduced. Three groups of electrodes are repeatedly disposed in an alternating sequence above an N-type channel (transfer channel). Among the three groups of electrodes, a predetermined DC bias voltage supplied from a DC power supply is applied to one group of electrodes. Between the remaining two groups of electrodes, a single-phase transfer clock H$\phi$ supplied from the exterior of the device is directly applied to one group of electrodes, while a transfer clock H$\phi$' produced by delaying the transfer clock H$\phi$ by a predetermined delay time in a delay circuit is applied to the other group of electrodes. Also disclosed is a solid-state imaging apparatus using the above-described charge transfer device.

9 Claims, 5 Drawing Sheets

CHARGE TRANSFER DEVICE AND SOLID-STATE IMAGING APPARATUS USING THE SAME DEVICE

BACKGROUND OF THE INVENTION

1. Field of the Invention

The present invention relates generally to a charge transfer device and a solid state imaging apparatus using this device. More particularly, the invention relates to a charge transfer device using a high-frequency clock of 10 MHz or higher as a transfer clock. The invention also relates to a solid-state imaging apparatus using this device as a horizontal transfer register.

2. Description of the Related Art

Figure 7:
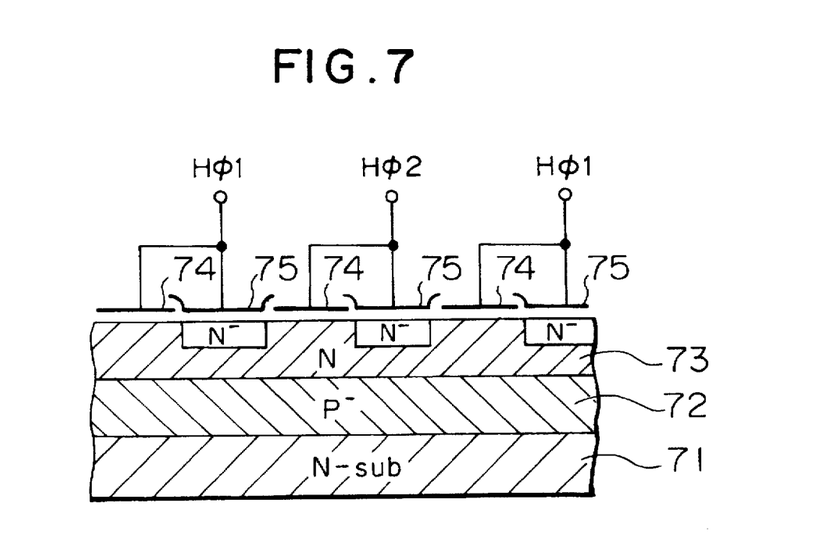
FIG. 7 is a sectional view of an example of conventional charge transfer devices.

FIG. 7 is a sectional view of a conventional horizontal transfer register for use in a CCD-type solid-state imaging apparatus. Referring to FIG. 7, an N-type channel 73 is formed on the obverse surface of an N-type semiconductor substrate 71 across a P-type well 72. First-layer and second-layer gate electrodes 74 and 75 formed of polysilicon or the like are repeatedly disposed in an alternating sequence above the N-type channel 73 through a gate insulating film (not shown).

Figure 8:
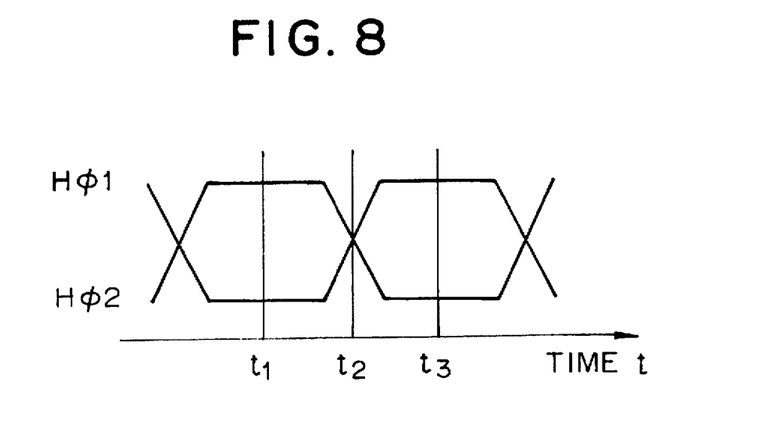
FIG. 8 is a waveform diagram of conventionally-used transfer clocks.
Figure 9:
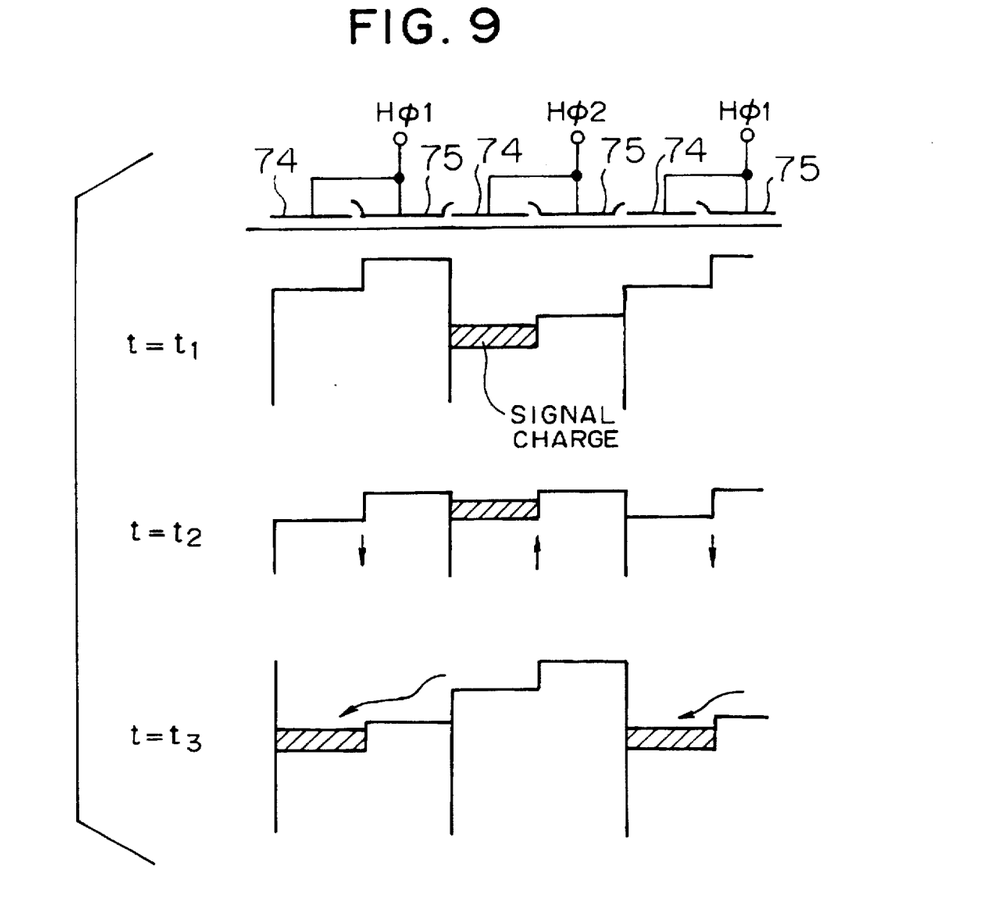
FIG. 9 is a potential distribution diagram for illustrating the operation of an example of conventional charge transfer devices.

N—ions are implanted under the gate electrodes 75 so as to form a storage region and a transfer region under the gate electrodes 74 and 75, respectively. Two-phase horizontal transfer clocks $H\phi1$ and $H\phi2$, as shown in FIG. 8, are alternately applied to the pairs of gate electrodes 74 and 75. The potential statuses at the timings $t_1$ through $t_3$ of applying these horizontal transfer clocks $H\phi1$ and $H\phi2$ to the gate electrodes 74 and 75 are illustrated in FIG. 9.

An explanation will now be given of the transfer operation of the two-phase horizontal transfer register constructed as described above while referring to the waveform diagram in FIG. 8 and the potential distribution diagram in FIG. 9. First, at the timing of $t=t_1$, the horizontal transfer clock $H\phi1$ is at a low level (hereinafter referred to as "L" level), while the horizontal transfer clock $H\phi2$ is at a high level (hereinafter referred to as "H" level). Accordingly, the potential well under the gate electrodes 74 and 75 to which the clock $H\phi2$ is applied becomes deeper, and more particularly, the portion below the gate electrode 74 (the storage region) has a larger potential than the portion below the gate electrode 75 (the transfer region), thereby causing signal charges to accumulate under the gate electrode 74 to which the clock $H\phi2$ is applied.

Subsequently, at the timing of $t=t_2$, since both of the horizontal transfer clocks $H\phi1$ and $H\phi2$ are at an intermediate level, the potential well under the gate electrodes 74 and 75 supplied with the clock $H\phi1$ is deepened, while the potential well under the gate electrodes 74 and 75 having the clock $H\phi2$ is made shallower, so that both of the potential wells are positioned at the equal level. Yet, the potential well under the gate electrode 74 supplied with the clock $H\phi2$ is still deeper than the potential well under the gate electrode 75 with the clock $H\phi1$, thereby causing the signal charges to remain under the gate electrode 74 to which the clock $H\phi2$ is applied.

Then, at the timing of $t=t_3$, the horizontal transfer clock $H\phi1$ is changed to the "H" level, while the horizontal transfer clock $H\phi2$ is caused to transition to the "L" level. Thus, the potential well of the gate electrodes 74 and 75 supplied with the clock $H\phi1$ becomes even more deeper, while the potential well of the gate electrodes 74 and 75 with the clock $H\phi2$ becomes even shallower. In this state, the potential well under the gate electrode 74 having the clock $H\phi2$ is shallower than the potential well under the gate electrode 75 with the clock $H\phi1$. Yet, the potential well under the gate electrode 74 to which the clock $H\phi1$ is applied is deeper than the potential well under the gate electrode supplied with the clock $H\phi1$. This causes the signal charges accumulated under the gate electrode 74 having the clock $H\phi2$ to pass through the portion under the gate electrode 75 with the clock $H\phi1$ and to be transferred to and accumulate in the portion under the gate electrode 74 having the clock $H\phi1$. The above-described operation is repeated to sequentially transfer signal charges in the leftward direction, as shown in FIG. 9.

However, the above-described two-phase horizontal transfer register requires two-phase horizontal transfer clocks $H\phi1$ and $H\phi2$ in order to transfer signal charges. A large number of clocks disadvantageously increases power consumption, the amount of heating and the number of terminals. Additionally, the horizontal transfer clocks $H\phi1$ and $H\phi2$, which are high-frequency clocks of 10 MHz or higher, create the problem of parasitic emissions.

Also, in order to determine the transfer direction by providing a predetermined potential gradient, the storage region and the transfer region are required to be formed separately, which requires an extra process step, thereby increasing the number of process steps. Further, signal charges can accumulate only under the gate electrodes 74 (the storage region) supplied with either of the horizontal transfer clocks $H\phi1$ and $H\phi2$ at the "H" level. This limits the region in which signal charges can accumulate to approximately one-fourth of the overall transfer length of the horizontal transfer register.

SUMMARY OF THE INVENTION

Accordingly, in view of the above-described problems, it is an object of the present invention to provide a charge transfer device in which the number of transfer clocks can be decreased, and also to provide a solid-state imaging apparatus using the above-described device.

In order to achieve the above object, according to one aspect of the present invention, there is provided a charge transfer device comprising: three groups of gate electrodes repeatedly disposed in an alternating sequence in the transfer direction above a transfer channel; first means for fixing the potential under one group of gate electrodes among the three groups of gate electrodes substantially at an intermediate level positioned between the maximum level and the minimum level of the respective potentials under the remaining two groups of gate electrodes to which transfer clocks are supplied; second means for supplying a single-phase transfer clock to one of the remaining two groups of gate electrodes; and third means for supplying the other group of gate electrodes with a transfer clock produced by delaying the single-phase transfer clock by a predetermined delay time.

According to another aspect of the present invention, there is provided a solid-state imaging apparatus using a charge transfer device as a transfer register, the device comprising: three groups of gate electrodes repeatedly disposed in an alternating sequence in the transfer direction above a transfer channel; first means for fixing the potential under one group of gate electrodes among the three groups of gate electrodes substantially at an intermediate level positioned between the maximum level and the minimum level of the respective potentials under the remaining two groups of gate electrodes to which transfer clocks are supplied; second means for supplying a single-phase transfer clock to one of the remaining two groups of gate electrodes; and third means for supplying the other group of gate electrodes with a transfer clock produced by delaying the single-phase transfer clock by a predetermined delay time.

According to still another aspect of the present invention, there is provided a charge transfer device comprising: three groups of gate electrodes repeatedly disposed in an alternating sequence in the transfer direction above a transfer channel; means for applying a predetermined bias voltage to one group of the three groups of gate electrodes; and means for supplying a single-phase transfer clock to one of the remaining two groups of gate electrodes and for supplying the other group of gate electrodes with a transfer clock generated by delaying the single-phase transfer clock by a predetermined delay time.

According to a further aspect of the present invention, there is provided a solid-state imaging apparatus comprising an imaging section including a plurality of photoelectric transducers for converting incident light into signal charges, and a charge transfer section for transferring the signal charges read from the plurality of photoelectric transducers, the charge transfer section comprising: three groups of gate electrodes repeatedly disposed in an alternating sequence in the transfer direction above a transfer channel; means for applying a predetermined bias voltage to one group of the three groups of gate electrodes; and means for supplying a single-phase transfer clock to one of the remaining two groups of gate electrodes and for supplying the other group of gate electrodes with a transfer clock generated by delaying the single-phase transfer clock by a predetermined delay time.

According to the charge transfer device and the charge transfer section of the solid-state imaging apparatus constructed as described above, among the three groups of electrodes arranged above the transfer channel, a predetermined bias voltage is applied to one group of the three groups of electrodes. The bias voltage is determined so that the potential under the above group of electrodes can be maintained substantially at an intermediate level between the maximum level and the minimum level of the respective potentials under the remaining two groups of electrodes. A single-phase transfer clock supplied from the exterior of the device is directly fed to one of the remaining groups of electrodes, while a transfer clock produced by delaying the above single-phase transfer clock by a predetermined delay time is supplied to the other group of electrodes. As a consequence, three-phase transfer driving can be implemented while only requiring the single-phase transfer clock supplied from the exterior of the device.

DESCRIPTION OF THE PREFERRED EMBODIMENTS

A detailed description will now be given of embodiments of the present invention with reference to the drawings.

Figure 1:
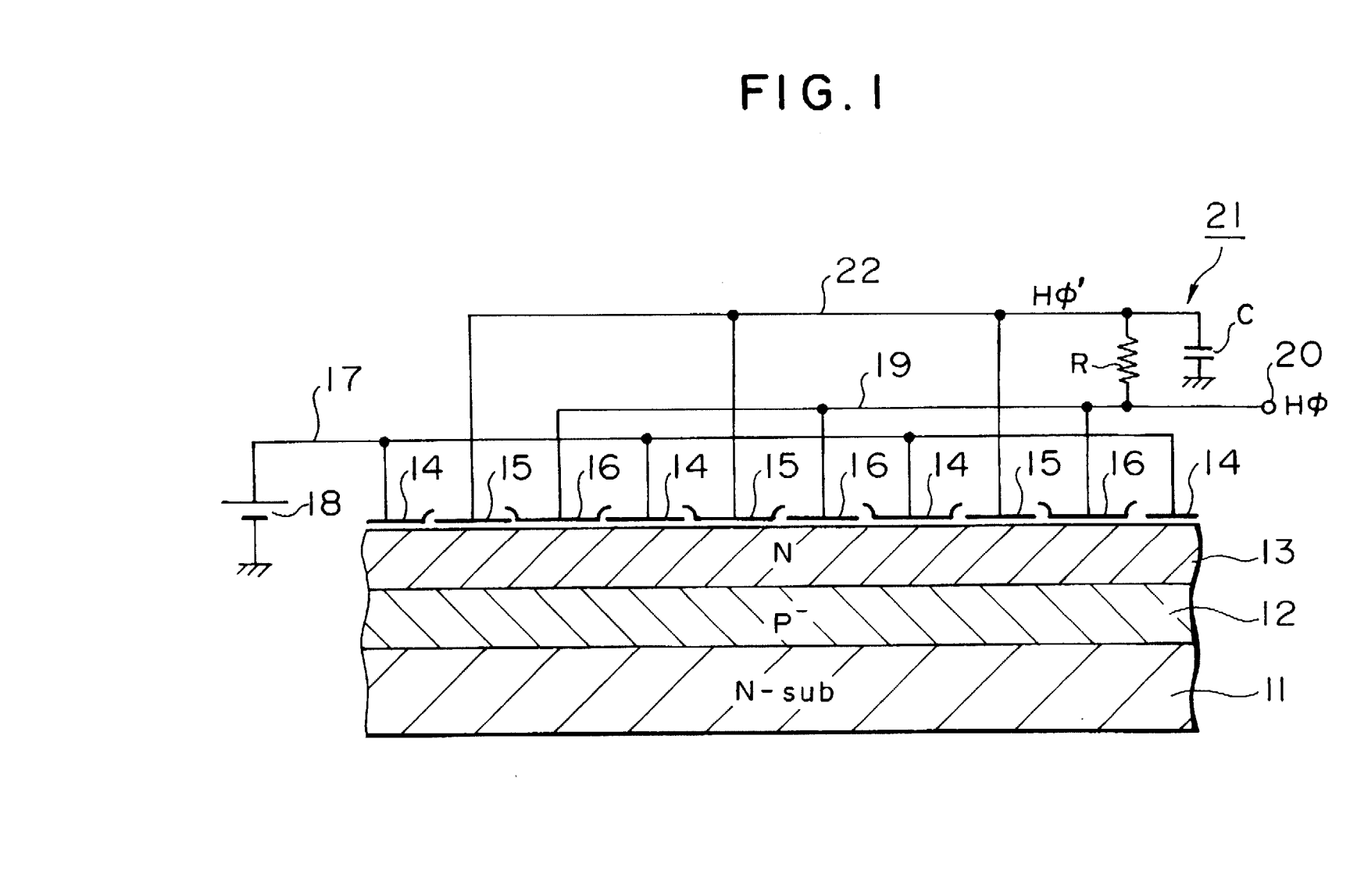
FIG. 1 is a sectional view illustrating an embodiment of the present invention.

Referring to a sectional view of a charge transfer device according to an embodiment of the present invention illustrated in FIG. 1, an N-type channel 13 is formed on the obverse surface of an N-type semiconductor substrate 11 across a P-type well 12. Repeatedly disposed above the N-type channel 13 via a gate insulating film (not shown) in an alternating sequence in the charge transfer direction are, for example, three groups of gate electrodes, i.e., the first, second and third groups, indicated by 14, 15 and 16.

These three groups of gate electrodes 14, 15 and 16 are constructed of polysilicon or the like in the form of two layers. More specifically, in the three groups of gate electrodes 14, 15 and 16 arranged in an alternating sequence, adjacent gate electrodes are alternately determined as first-layer and second-layer electrodes regardless of the electrode group. This two-layer structure is similar to a known type of two-phase driving electrode structure.

Figure 2:
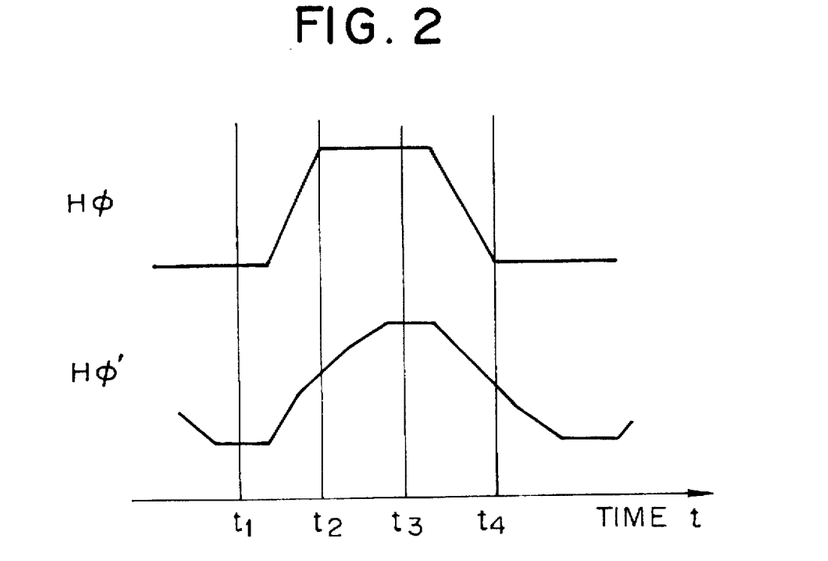
FIG. 2 is a waveform diagram of a transfer clock used in the present invention.

According to the electrode structure in which the three groups of gate electrodes 14, 15 and 16 are repeatedly disposed in a sequential order, the first group of gate electrodes 14 are interconnected to each other by means of wiring 17 through which a predetermined DC bias voltage is applied to the first gate electrodes 14 from a DC power supply 18. The DC bias voltage is set to approximately one half of the peak voltage of the transfer clock Hφ. Also, the third group of gate electrodes 16 are interconnected to each other by means of wiring 19 through which the transfer clock Hφ, as illustrated in FIG. 2, supplied from the exterior of the device via a clock terminal 20 is fed to the third group of gate electrodes 16.

Further, a delay circuit 21 formed of an integrating circuit having a resistor R and a capacitor C is provided to delay the transfer clock Hφ by a predetermined delay time. The waveform of the delayed transfer clock Hφ' is shown in FIG. 2. The second group of gate electrodes 15 are also interconnected to each other by means of wiring 22 through which the delayed transfer clock Hφ' is supplied to the second group of gates 15.

The delay time produced by the delay circuit 21 will now be explained. If the clock frequency of the transfer clock Hφ is set to, for example, 14 MHz, a clock cycle completes in approximately 70 ns, and approximately 10 ns is required, as shown in FIG. 2, for the rising of the transfer clock Hφ. It is thus proved that the delay time of the delay circuit 21 can be suitably set to approximately 20 ns.

Figure 3:
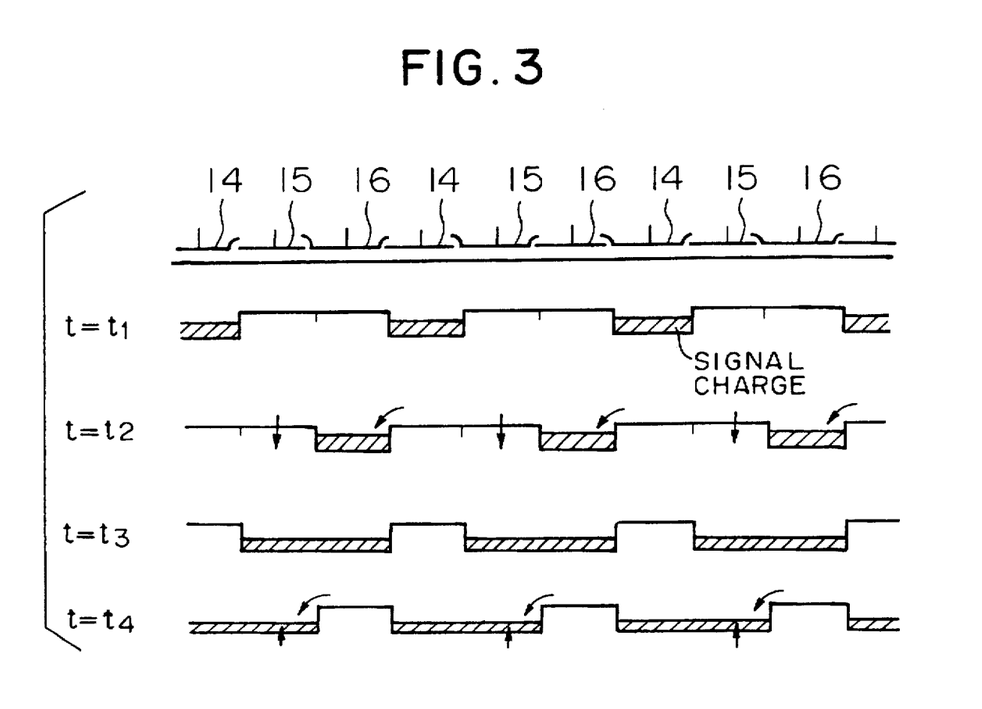
FIG. 3 is a potential distribution diagram for illustrating the operation of an embodiment of the present invention.

A description will now be given of the transfer operation of the charge transfer device constructed as described above while referring to the waveform diagram in FIG. 2 and the potential distribution diagram in FIG. 3.

Since a DC bias voltage is applied to the first gate electrodes 14 from the DC power supply 18, the potential under the gate electrodes 14 is maintained substantially at an intermediate level. In this state, at the timing of $t=t_1$, the potential wells under the respective second and third gate electrodes 15 and 16 are shallow because both the transfer clock Hφ and the delayed transfer clock Hφ' are at the "L" levels. Thus, signal charges accumulate under the first group of gate electrodes 14 having the largest potential.

Then, at the timing of t=t$_2$, the transfer clock Hφ is changed to the "H" level, and thus, the potential well under the third group of gate electrodes 16 becomes the deepest, thereby transferring the signal charges accumulated under the first gate electrodes 14 to the third group of gate electrodes 16. At this time, since the transfer clock Hφ' is still at an intermediate level, the potential well under the second group of gate electrodes 15 is becoming deeper, and at the timing of t=t$_2$, it is placed at substantially the same level as the potential well under the first gate electrodes 14.

At the timing of t=t$_3$, both the transfer clock Hφ and the delayed transfer clock Hφ' are changed to the "H" levels, thereby causing the potential well under the second group of gate electrodes 15 to be at the deepest level, which is equal to the level of the potential well under the third group of gate electrodes 16. Hence, the signal charges transferred to the portions under the third group of gate electrodes 16 from the portions under the first group of gate electrodes 14 at the timing of t=t$_2$ are equally distributed under the second and third groups of gate electrodes 15 and 16.

At the timing of t=t$_4$, the transfer clock Hφ is caused to transition to the "L" level, while the transfer clock Hφ' still remains at an intermediate level. Accordingly, the potential well under the third group of gate electrodes 16 becomes the shallowest, and in contrast, the potential well under the second group of gate electrodes 15 is caused to be substantially at the same level as the potential well under the first group of gate electrodes 14. As a result, the signal charges under the second and third groups of gate electrodes 15 and 16 are transferred to the first and second gate electrodes 14 and 15 and are equally distributed therein.

Then, the transfer clock Hφ' is caused to transition to the "L" level, which changes the potential well under the second group of gate electrodes 15 to be the shallowest, which is equal to the level of the potential well under the third group of gate electrodes 16. This state is the same as the state at the timing of t=t$_1$. In this manner, the aforedescribed operation can be repeated to transfer signal charges in the leftward direction in FIG. 3 without mixing adjacent signal charges.

As discussed above, the three groups (first, second and third) of electrodes 14, 15 and 16 are repeatedly disposed in an alternating sequence above the N-type channel (transfer channel) 13. A predetermined DC bias voltage is applied to one group of electrodes, i.e., the first group of electrodes 14, while a single-phase transfer clock Hφ supplied from the exterior of the device is fed to one of the remaining groups of electrodes, i.e., the third group of electrodes 16, and the transfer clock Hφ' produced by delaying the transfer clock Hφ is applied to the other group of electrodes, i.e., the second group of electrodes 15. With this arrangement, three-phase transfer driving can be implemented while using only the single-phase transfer clock Hφ supplied from the exterior of the device.

In this fashion, the single-phase transfer clock Hφ is used to achieve three-phase signal transfer driving, thereby making it possible to reduce the number of terminals by one and also to decrease power consumption, the heating amount and parasitic emissions over conventional two-phase driving. Further, it is not necessary to separately form the storage region and the transfer region in the transfer channel, which is required for a two-phase driving horizontal transfer register of a known type, thereby reducing the number of process steps. Additionally, the signal charge storage region can be enlarged to one third of the overall transfer length, which is conventionally restricted to one fourth of the overall transfer length of the known two-phase driving type. This can further increase the amount of charges to be handled, which is useful for charge transfer devices with a restricted channel width due to limitations of the chip size.

Figure 4:
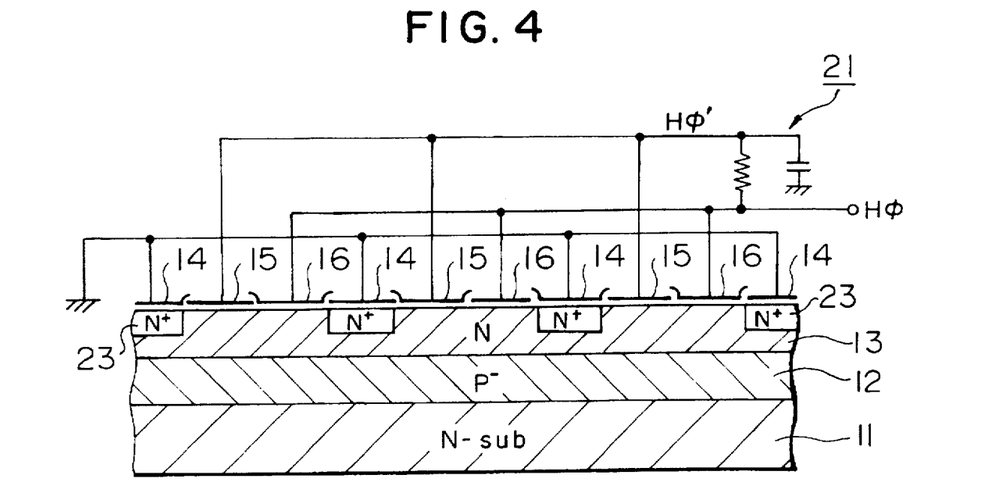
FIG. 4 is a sectional view illustrating an example of modifications of an embodiment of the present invention.

In the aforedescribed embodiment, a DC bias voltage is applied to the first group of gate electrodes 14 from the DC power supply 18 so that the potential well under the first group of gate electrodes 14 can be maintained substantially at an intermediate level between the maximum level and the minimum level of the potential wells of the second and third groups of gate electrodes 15 and 16. This construction may be achieved, as illustrated in FIG. 14, by the following means. High-concentration N-type ions are implanted into the obverse surface of the substrate under the first gate electrodes 14 so as to form N$^+$-type diffusion regions 23. Alternatively, a ground level may be applied to the first group of gate electrodes 14, so that the potential well under the first gate electrodes 14 can be maintained substantially at an intermediate level between the maximum level and the minimum level of the potential wells under the second and third groups of gate electrodes 15 and 16.

Figure 5:
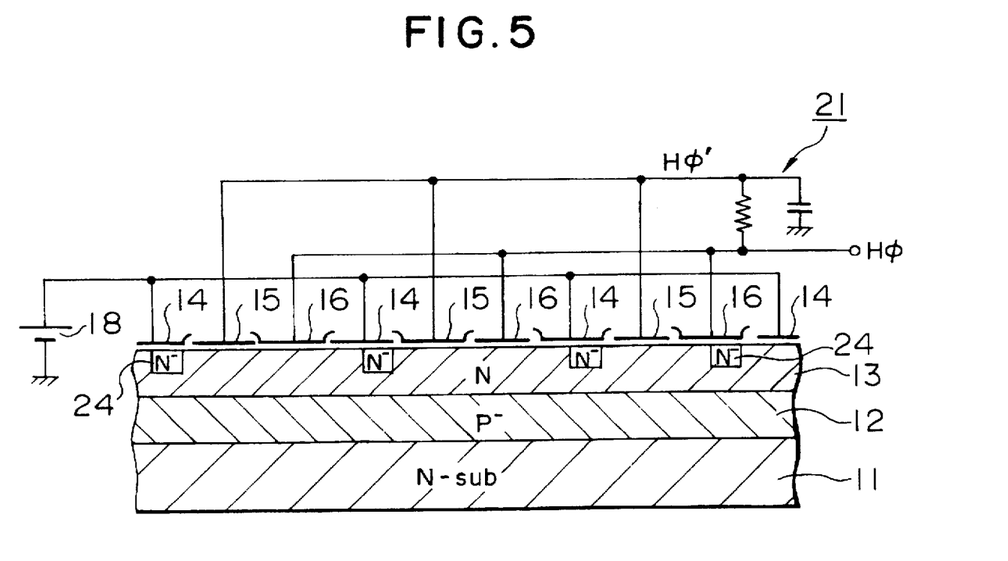
FIG. 5 is a sectional view illustrating another example of modifications of an embodiment of the present invention.

Moreover, as illustrated in FIG. 5, low-concentration N-type ions may be implanted into part of a portion under the first group of gate electrodes 14 adjacent to the backward end in the transfer direction so as to form N$^-$-type diffusion regions 24, thereby producing a potential gradient tilting downward in a step-like form in the transfer direction for the potential wells under the first group of gate electrodes 14 serving as the storage regions. This enhances a smooth transfer operation of signal charges from the portion under the first group of gate electrodes 14 to the portion under the third gate electrodes 16, thereby improving transfer efficiency. For this modification, the concentration of the N-type ions to be implanted may be variously changed as required in the transfer direction to increase the number of potential steps so that the potential gradient can be ideally continuous, thereby enhancing a more smooth transfer operation of signal charges.

Further, although in this embodiment an integrating circuit is used to construct the delay circuit 21, this is not exclusive. Any circuit configuration may be employed as long as it can supply a desired delay time to a single-phase transfer clock Hφ. Additionally, in the above-described embodiment, the transfer clock Hφ' is generated within the device by the use of the delay circuit 21. However, it may be separately applied from the exterior of the device, though the effect of a reduced number of terminals is eliminated. In this case, the phase relationship between the two-phase transfer clocks Hφ and Hφ' can be changed to set a desired signal-charge transfer direction.

The charge transfer device constructed in accordance with this embodiment can be suitably employed as, for example, a horizontal transfer register for use in a CCD-type solid-state imaging apparatus using a high-frequency horizontal transfer clock.

Figure 6:
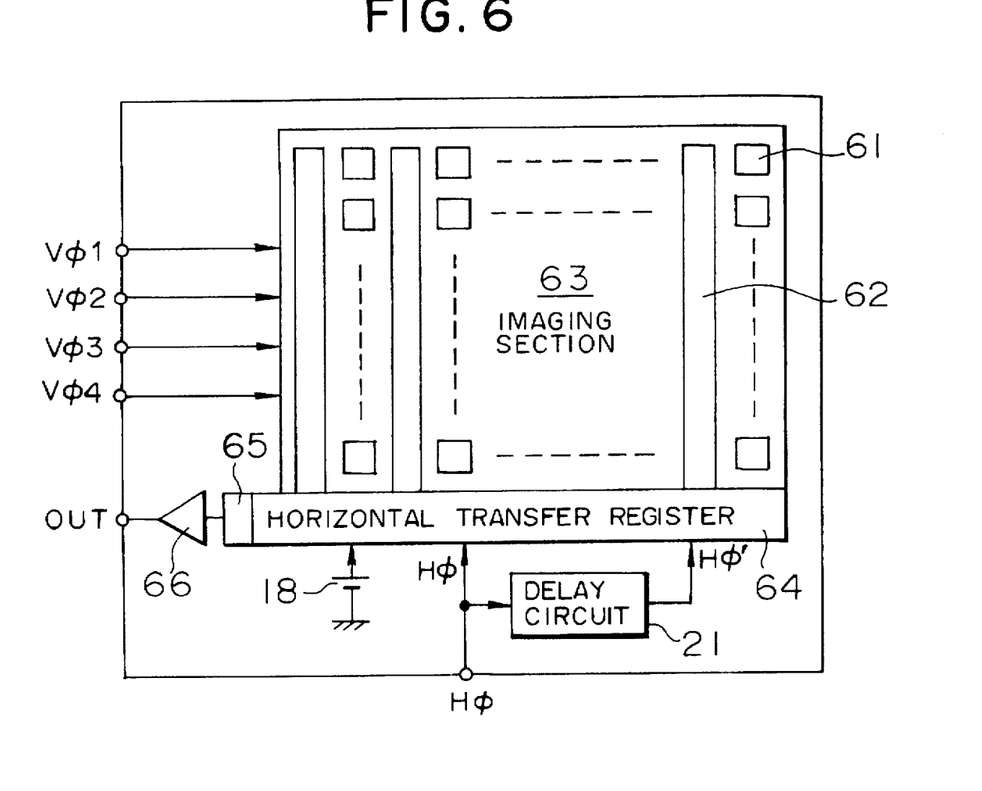
FIG. 6 is a schematic diagram illustrating an embodiment of a solid-state imaging apparatus according to the present invention.

FIG. 6 is a schematic diagram illustrating an embodiment of a CCD-type solid-state imaging apparatus using the charge transfer device of the present invention as a horizontal transfer register. Referring to FIG. 6, an imaging section 63 comprises a plurality of photoelectric transducers 61 disposed in a matrix form in the vertical and horizontal directions for accumulating signal charges according to the quantity of incident light; and a plurality of vertical transfer registers 62 each disposed adjacent to a vertical array of photoelectric transducers 61, for vertically transferring the signal charges read from the corresponding array of photoelectric transducers 61. In this imaging section 63, the photoelectric transducers 61 are formed of, for example, P-N junction photodiodes, while the vertical transfer registers 62 are comprised of CCDs.

The signal charges accumulated in the photoelectric transducers 61 are read to the corresponding vertical transfer registers 62 via readout gates (not shown). The vertical transfer registers 62 are driven to transfer the signal charges by, for example, four-phase vertical transfer clocks V$\phi$1 through V$\phi$4. The signal charges read out to the vertical transfer registers 62 are sequentially transferred in the vertical direction by an amount of signal charges corresponding to one scanning line during part of the horizontal blanking period. Disposed below the imaging section 63 as viewed in FIG. 6 is a horizontal transfer register 64 for sequentially transferring signal charges by an amount associated with one line from the plurality of vertical transfer registers 62. This horizontal transfer register 64 is also formed of a CCD.

The aforedescribed charge transfer device is used as the horizontal transfer register 64. As has been explained with reference to FIG. 1, in this horizontal transfer register 64, the three groups (first, second and third) of gate electrodes 14, 15 and 16 are repeatedly disposed as transfer electrodes in an alternating sequence. A predetermined DC bias voltage is applied to the first group of gate electrodes 14 from the DC power supply 18, while the single-phase horizontal transfer clock H$\phi$ fed from the exterior of the device is directly supplied to the third group of gate electrodes 16, and the horizontal transfer clock H$\phi$' generated by delaying the clock H$\phi$ in the delay circuit 21 by a predetermined delay time is supplied to the second group of gate electrodes 15.

In the above-described horizontal transfer register 64, by merely using the single-phase horizontal transfer clock H$\phi$ supplied from the exterior of the device, three-phase transfer driving can be implemented to perform the three-phase driving horizontal transfer operation. Thus, signal charges can be sequentially transferred by an amount corresponding to each line in the horizontal direction in a horizontal effective scanning period subsequent to a horizontal blanking period. A charge detecting section 65, which is constructed of, for example, a floating diffusion amplifier, is disposed at the forward end of the horizontal transfer register 64 in the transfer direction. The horizontally-transferred signal charges are sequentially converted into signal voltages in the charge detecting section 65. The signal voltage is amplified in an output amplifier 66 and is then sent to the exterior of the device as an CCD output in accordance with the amount of incident light from a subject.

In this manner, the charge transfer device constructed in accordance with the present invention is employed as the horizontal transfer register 64 for use in the CCD solid-state imaging apparatus, thereby requiring only the single-phase horizontal transfer clock H$\phi$. Accordingly, this can decrease the number of terminals of the CCD solid-state imaging apparatus and also reduce power consumption, the heating amount and parasitic emissions. Additionally, the signal charge storage region can be enlarged to one third of the overall transfer length of the horizontal transfer register 64, thereby enabling an increase in the amount of charges to be handled.

The charge transfer device of the present invention is applicable not only to a horizontal transfer register for use in a CCD solid-state imaging apparatus, but also to a charge transfer section in a CCD delay device or in a CCD linear sensor. In particular, the invention can be suitably used as a charge transfer section using a high-frequency transfer clock of 10 MHz or higher.

As will be clearly understood from the foregoing description, the present invention offers the following advantages.

Three groups of electrodes are repeatedly arranged in an alternating sequence above the transfer channel in the transfer direction. A predetermined bias voltage is applied to one group of electrodes, while a single-phase transfer clock provided from the exterior of the device and a transfer clock produced by delaying the single-phase transfer clock are supplied to the remaining two groups of electrodes. With this arrangement, only a single-phase clock is required to perform the signal-charge transfer operation, which heretofore necessitates two-phase transfer clocks. Along with the use of a single-phase clock, the number of terminals can be decreased, and also, power consumption, the heating amount, and parasitic emissions can be reduced.

Moreover, it is not necessary to separately form the storage region and the transfer region in the transfer channel, thereby decreasing the number of process steps. Further, the signal-charge storage region can be enlarged to one third of the overall transfer length, which is conventionally limited to one fourth of the overall transfer length of a known two-phase driving type of charge transfer device. This can increase the amount of charges to be handled.

What is claimed is:

1. A charge transfer device comprising:
    three groups of gate electrodes repeatedly disposed in an alternating sequence in the transfer direction above a transfer channel;
    first means for fixing the potential under one group of gate electrodes among said three groups of gate electrodes substantially at an intermediate level positioned between the maximum level and the minimum level of the respective potentials under the remaining two groups of gate electrodes to which transfer clocks are supplied;
    second means for supplying a single-phase transfer clock to one of said remaining two groups of gate electrodes; and
    third means for supplying the other group of gate electrodes with a transfer clock produced by delaying said single-phase transfer clock by a predetermined delay time.

2. A charge transfer device according to claim 1, wherein said first means applies a predetermined bias voltage to one group of said three groups of gate electrodes.

3. A charge transfer device according to claim 1, wherein low-concentration ions of the same type as the transfer channel are implanted into a portion adjacent to the backward end in the transfer direction under one of said three groups of gate electrodes on the obverse surface of a substrate, thereby forming a diffusion region.

4. A charge transfer device according to claim 1, wherein said first means implants high-concentration ions of the same type as the transfer channel into a portion under one of said three groups of gate electrodes on the obverse surface of the substrate so as to form a diffusion region, and a ground level is applied to said one group of gate electrodes.

5. A charge transfer device according to claim 1, wherein said third means comprises a delay circuit formed of an integrating circuit.

6. A solid-state imaging apparatus using a charge transfer device as a transfer register, said device comprising:

three groups of gate electrodes repeatedly disposed in an alternating sequence in the transfer direction above a transfer channel;

first means for fixing the potential under one group of gate electrodes among said three groups of gate electrodes substantially at an intermediate level positioned between the maximum level and the minimum level of the respective potentials under the remaining two groups of gate electrodes to which transfer clocks are supplied;

second means for supplying a single-phase transfer clock to one of said remaining two groups of gate electrodes; and third means for supplying the other group of gate electrodes with a transfer clock produced by delaying said single-phase transfer clock by a predetermined delay time.

7. A charge transfer device comprising:

three groups of gate electrodes repeatedly disposed in an alternating sequence in the transfer direction above a transfer channel;

means for applying a predetermined bias voltage to one group of said three groups of gate electrodes; and means for supplying a single-phase transfer clock to one of the remaining two groups of gate electrodes and for supplying the other group of gate electrodes with a transfer clock generated by delaying said single-phase transfer clock by a predetermined delay time.

8. A charge transfer device according to claim 7, wherein said predetermined bias voltage is applied to fix the potential under said one group of gate electrodes substantially at an intermediate level positioned between the maximum level and the minimum level of the respective potentials under the remaining two groups of gate electrodes to which the transfer clocks are supplied.

9. A solid-state imaging apparatus comprising an imaging section including a plurality of photoelectric transducers for converting incident light into signal charges, and a charge transfer section for transferring the signal charges read from said plurality of photoelectric transducers, said charge transfer section comprising:

three groups of gate electrodes repeatedly disposed in an alternating sequence in the transfer direction above a transfer channel;

means for applying a predetermined bias voltage to one group of said three groups of gate electrodes; and means for supplying a single-phase transfer clock to one of the remaining two groups of gate electrodes and for supplying the other group of gate electrodes with a transfer clock generated by delaying said single-phase transfer clock by a predetermined delay time.

* * * * *